United States Patent
Liu et al.

[11] Patent Number: 6,121,789
[45] Date of Patent: Sep. 19, 2000

[54] OUTPUT BUFFER WITH CONTROL CIRCUITRY

[75] Inventors: Lin-shih Liu; Dzung Huu Nguyen, both of Fremont, Calif.

[73] Assignee: Winbond Electronics Corporation, Taiwan

[21] Appl. No.: 09/148,739

[22] Filed: Sep. 4, 1998

[51] Int. Cl.[7] .................................................. H03K 17/16
[52] U.S. Cl. ................................. 326/26; 326/83; 326/86
[58] Field of Search ................................. 326/26, 27, 83, 326/86

[56] References Cited

U.S. PATENT DOCUMENTS

| | | |
|---|---|---|
| 4,857,770 | 8/1989 | Partovi et al. |
| 5,121,013 | 6/1992 | Chuang et al. |
| 5,124,577 | 6/1992 | Davis et al. ............................... 326/83 |
| 5,153,457 | 10/1992 | Martin et al. ............................. 326/26 |
| 5,367,210 | 11/1994 | Lipp ........................................... 326/26 |
| 5,438,545 | 8/1995 | Sim ...................................... 365/189.05 |
| 5,528,172 | 6/1996 | Sundstrom ................................. 326/80 |
| 5,598,119 | 1/1997 | Thayer et al. ............................. 326/83 |
| 5,877,647 | 3/1999 | Vajapey et al. ............................ 326/27 |
| 5,914,618 | 6/1999 | Mattos ....................................... 326/83 |

*Primary Examiner*—Michael Tokar
*Assistant Examiner*—Don Phu Le
*Attorney, Agent, or Firm*—Townsend and Townsend and Crew LLP

[57] ABSTRACT

Techniques and circuitry are used to reduce noise at the output (136) of an integrated circuit. The control circuit of the output buffer may reduce ground or power noise, or both. The control circuitry includes a ramp control circuit (153, 163) and di/dt or noise detect circuit (155, 165). A slew rate of the ramp control circuit output (173, 175) is controlled by the di/dt detect circuit. The di/dt detect circuit adjusts the slew rate of the ramp control circuit depending on the noise at the supply node which may be power (182) or ground (185), or both. The di/dt detect circuit may also be used to increase the slew rate of the ramp control circuit output to provide better performance.

26 Claims, 2 Drawing Sheets

OUTPUT BUFFER WITH CONTROL CIRCUITRY

BACKGROUND

The present invention relates generally to integrated circuits. More particularly, the present invention relates to an output control circuit for use to reduce power or ground bounce noise, or both.

Digital logic circuits are widely used in the areas of electronics and computer-type equipment. One such use of digital logic circuits is to provide an interface function between one integrated circuit chip and another integrated circuit chip. An output buffer is an important component for performing this interface function. The output buffer generates, when enabled, an output signal which is a function of a data signal received from internal logical circuitry of the integrated circuit.

An output buffer circuit typically uses a pull-up transistor connected in series between first and second power supply terminals. The first power supply terminal maybe supplied with a positive potential which is connected to a power supply potential node. The second power supply terminal may be supplied with a ground potential, which is connected to a ground potential node. The connection point of the pull-up and pull-down field-effect transistors is further joined to an output terminal.

Dependent upon the logic state of the data input signal (and an output enable signal for a tristateable output buffer), either the pull-up or pull-down transistor is quickly turned on and the other one of them is turned off. Such rapid switching on and off the pull-up and pull-down transistors causes sudden surges of current creating what is commonly known as current spikes. These current spikes will flow through the impedance and inductive components of power supply lines so as to cause inductive noise at the internal power supply potential and the internal ground potential nodes of the output buffer. In particular, when the pull-down transistor is quickly turned on a large instantaneous current cooperates with the line inductance to pull up the internal ground potential which is defined as "ground bounce noise." The line inductance and resistance may be a parasitic artifact from the bonding wires and lead frame.

Similarly, when the pull-up transistor is turned on too quickly, there may be "power bounce noise" on the power potential.

Therefore, it is desirable to provide an output current control circuit for use with an output buffer which reduces ground bounce and power bounce noise, but yet provides high speed of operation.

SUMMARY OF THE INVENTION

The present invention provides techniques and circuits for reducing noise at the output of an integrated circuit. In an embodiment, the present invention is an output buffer with control circuitry to reduce ground or power noise, or both. The output buffer includes a ramp control circuit and di/dt detect circuit.

The ramp circuit provides an output for driving an output driver of the integrated circuit. The slew rate of the ramp circuit output is controlled by the di/dt detect circuit. The di/dt detect circuit monitors the noise at the supply node (e.g., power or ground). When the noise is above a threshold value, the di/dt detect circuit provides a signal to the ramp circuit to slow the slew rate of the ramp circuit output. A slower slew rate on the ramp circuit corresponds to a slower slew rate for the output driver. This will reduce noise on the supply node.

The circuitry of the present invention may also increase the slew rate of the ramp circuit when the noise is below a threshold value. This will increase the slew rate at the output of the integrated circuit, and will generally provide performance benefits.

In a specific embodiment, a ramp control of the output buffer is controlled by a di/dt or supply noise detect circuit. When the di/dt detector detects a di/dt level from a transistor coupled to a control electrode of the output driver, a signal if provided to the ramp control circuit to slow the ramp of the output driver. This limits the supply noise to a level, which may be specified by the design. The di/dt detector may also signal the ramp control to speed up when the di/dt drops below a certain level.

An aspect of the present invention is an output buffer including a pull-down driver coupled between an output node and a ground potential; a ramp control circuit coupled between a logical input signal and a control electrode input to the pull-down driver, where the ramp control has an input coupled to the output node; and a ground noise detect circuit coupled to the ground electrode, and coupled to control the ramp circuit to decrease a slew rate of a low-to-high transition of a signal applied to the control electrode input to the pull-down driver in response to ground noise above a threshold value at the ground electrode.

A further aspect of the invention is output buffer including a pull-down driver having a control electrode; and a control circuit. The control circuit includes a first transistor having a gate coupled to the control electrode of the pull-down driver, where a source electrode of the first transistor is coupled to a ground potential; a second transistor, diode-connected and coupled between the first transistor and the ground potential; and a third transistor, diode-connected and coupled between a power potential and the first and second transistors.

An even further aspect of the present invention is a method of reducing noise at an output of an integrated circuit. An output driver is coupled to a supply and the output of the integrated circuit. A ramp circuit provided to drive a control electrode of the output driver. A noise detection circuit is provided to monitor noise at the supply. A signal from the noise detection circuit is provided to increase a slew rate of a signal from the ramp circuit when the noise is below a threshold value.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
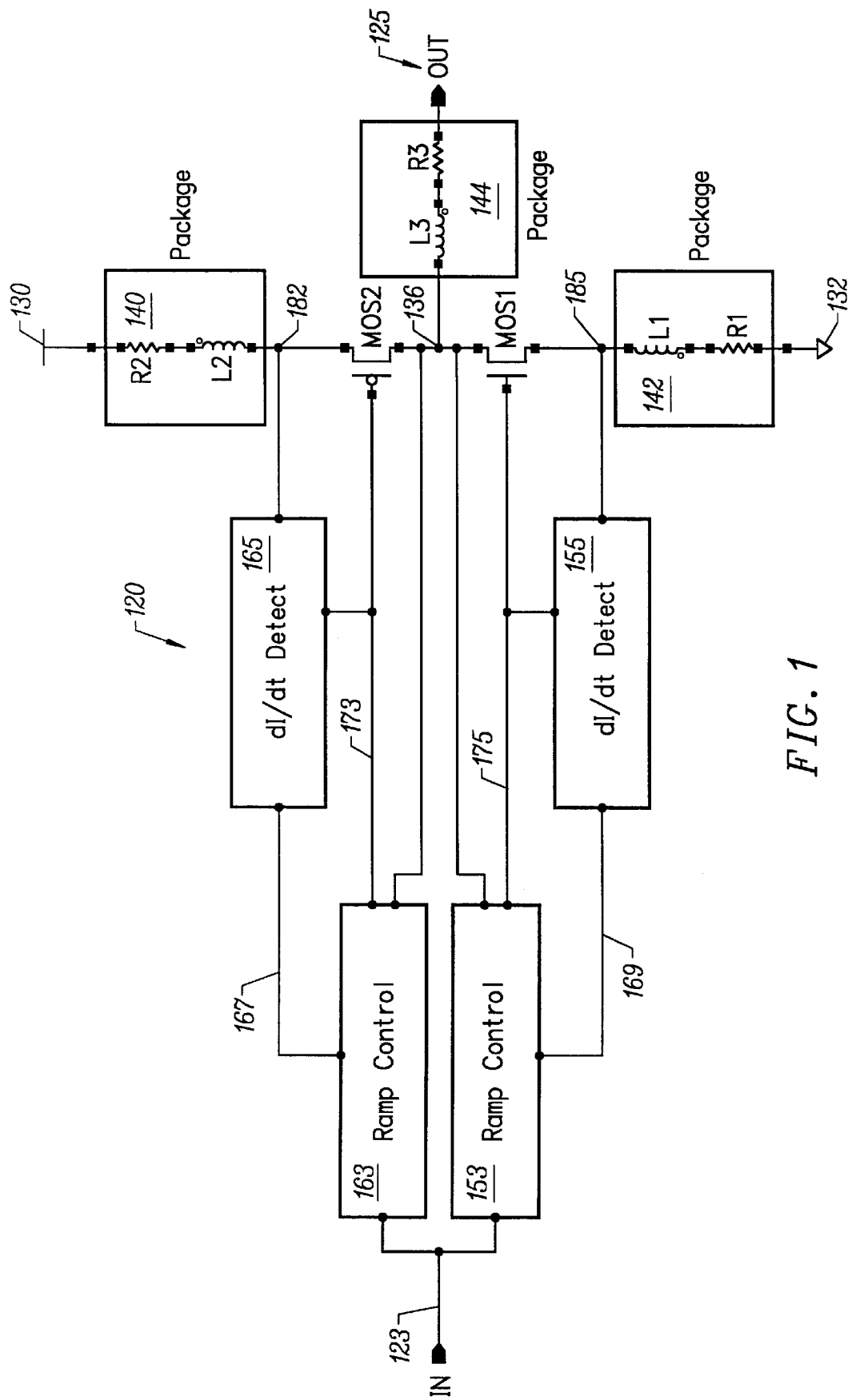
FIG. 1 shows a block diagram of an output buffer 120 of the present invention.

FIG. 1 shows a block diagram of an output buffer 120 of the present invention. This output buffer may be used in many types of integrated circuits including DRAMs, SRAMs, Flash memories, EPROMs, EEPROMs, FPGAs, PLDs, microprocessors, gate arrays, ASICs, controllers, and many others. Output buffer 120 takes a signal at an IN input node 123 and buffers this to an OUT output node 125. The OUT node is typically an pad of the integrated circuit.

The output buffer may be inverting or noninverting depending on the number of inversions in the path from IN to OUT. The output buffer may also be a tristateable output buffer. In such an embodiment, when the output buffer is disabled, OUT will be in a tristate or high impedance state. When the output buffer is enabled, OUT will be either in a logic high or logic low depending on the signal at IN.

The output buffer may be used an input/output or I/O pad, where the same pad is used for the input and output of data. For example, when the output buffer is in the high impedance state, the pad may be used to input data to an input buffer (not shown). And then the output buffer is enabled, the output buffer may be used to output data at the pad.

Output buffer 120 has a pull-up driver MOS2 and a pull-down driver MOS1 coupled between a positive power supply 130 and ground supply 132. The positive supply may be referred to as VDD or VCC. The ground supply may be referred to as VSS or ground. A node 136 between the pull-up driver and pull-down driver is coupled to OUT. In this specific embodiment, MOS1 is an NMOS transistor and MOS2 is a PMOS device. This output buffer may be referred to as having a PMOS pull-up driver. In other embodiments, however, MOS2 may be an NMOS device, and the output buffer may then be referred to as having an NMOS pull-up driver. When an NMOS pull-up driver is used, appropriate changes will be made to the circuitry.

Each of the blocks 140, 142, and 144 contains inductance and resistance which are representative of the parasitics of the packaging. Block 140 includes an inductor L2 and resistor R2. Block 142 includes an inductor L2 and resistor R1. And, block 144 includes an inductor L3 and resistor R3. The packaging parasitics cause ground and power noise since the large changes in current may not pass through an inductance without corresponding changes in voltage. This relationship is represented by the equation:

$$V = L * di/dt.$$

V is the voltage change, L is the inductance, and di/dt is the change in current. Therefore, according to this relationship, the greater the change in di/dt, the larger the V, which is representative of the ground or power noise or both. Ground and power noise may be sometimes referred to as ground or power "bounce" because of the voltage ringing the ground or power lines. Noise is undesirable since it may cause logical or function errors, degrade the performance of the integrated circuit, and other problems.

Noise may occur at the power supply node or ground supply node, or both. For example, when the output buffer transitions from high to low, there may be ground bounce because current is being rapidly discharged through L1 and R1. And similar, there may be power bounce during a low-to-high transition because of rapid charging current.

The output buffer of the present invention has a ramp control circuit 153 and di/dt circuit 155 for reducing ground bounce. The output buffer of the present invention has a ramp control circuit 163 and di/dt circuit 165 for reducing power bounce. Although this embodiment of the present invention has both ground and power noise reducing circuits, other embodiments may include only the ground noise or only power noise reducing circuit. Depending on the design, area available on the integrated circuit chip, and other factors, it may be desirable to use only the ground noise or power noise reducing circuit by itself.

For the power noise reducing circuitry, ramp control 163 has an input from IN, node 136, and an input 167 from di/dt detect 165. Ramp control 163 has an output 173 that is coupled to a control electrode or gate of MOS2. The di/dt detect circuit 165 is also coupled to the control electrode of MOS2 and a power node 182 which is internal to the integrated circuit.

For the ground noise reducing circuitry, ramp control 153 has an input from IN, node 136, and an input 169 from di/dt detect 155. Ramp control 153 has an output 175 that is coupled to a control electrode or gate of MOS1. The di/dt detect circuit 155 is also coupled to the control electrode of MOS2 and a ground node 185 which is internal to the integrated circuit.

In operation, ramp control 153 is a predriver to pull-down driver MOS1. When di/dt circuit 155 senses ground noise at node 185 above a user-definable threshold, di/dt circuit 155 adjusts ramp circuit 153 through control line 169 to adjust the ramp circuit's slew rate. This reduces any ground noise. The di/dt detect circuit 155 also may sense the slew rate at node 175 in order make the appropriate adjustments. By reducing the slew rate at node 175, MOS1 will turn on more slowly which reduces ground noise because there will be a smaller di/dt through MOS1. Also, by monitoring and controlling the slew rate at node 175, the di/dt through MOS1 may be adjusted throughout the high-to-low transition to minimize ground noise.

If a constant pull-down current is used, di/dt through MOS1 will be zero, and there will be no ground noise. However, it is generally desirable to maximize the performance of the output buffer. Therefore, the circuitry is designed to maximize the amount of di/dt through MOS1 while at the same time minimizing the ground noise to below a threshold amount.

The operation of the circuitry to reduce power noise is similar to that for the ground noise reduction circuitry. In brief, when di/dt circuit 165 senses power noise at node 182 above a user-definable threshold, di/dt circuit 165 adjusts ramp circuit 163 through control line 167 to adjust the ramp circuit's slew rate. This reduces any power noise. The di/dt detect circuit 165 also may sense the slew rate at node 173 in order make the appropriate adjustments. By reducing the slew rate at node 173, MOS2 will turn on more slowly which reduces ground noise because there will be a smaller di/dt through MOS2. Also, by monitoring and controlling the slew rate at node 173, the di/dt through MOS2 may be adjusted throughout the low-to-high transition to minimize power noise.

Figure 2:
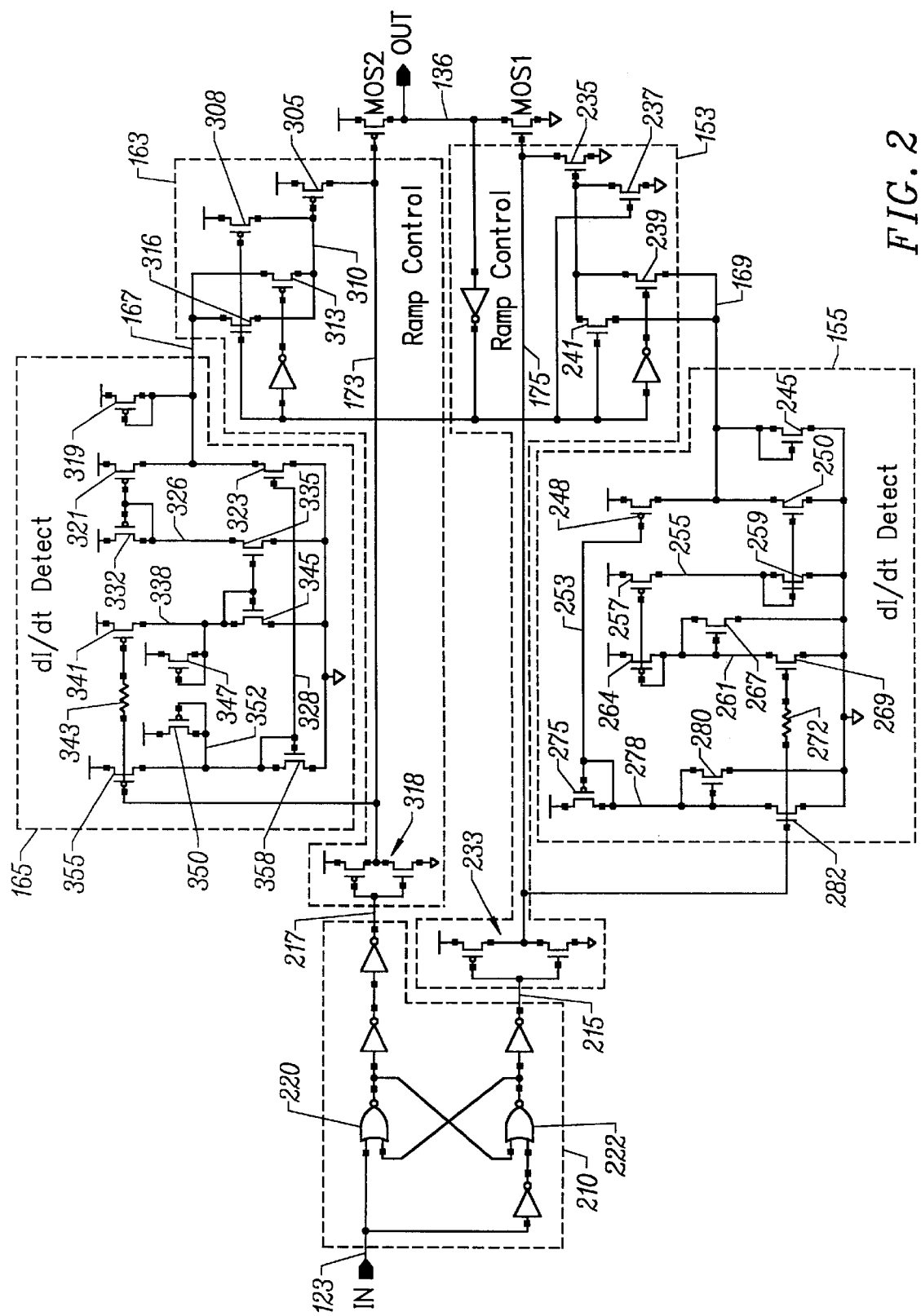
FIG. 2 shows a specific embodiment of the power and ground noise reduction circuitry of the present invention.

FIG. 2 shows a specific embodiment of the power and ground noise reduction circuitry of the present invention. The output buffer of FIG. 2 is similar to what is shown in FIG. 1. FIG. 2 provides more detailed circuit schematics for the ramp control 153, di/dt detect 155, ramp control 163, and di/dt detect 165. As discussed above, these circuits may be used separately, or in combination with another, and with other circuits.

In FIG. 2, IN input 123 is coupled to logical circuitry 210 which provides nonoverlapping outputs 215 and 217 to drive the output drivers MOS1 and MOS2, respectively. Logical circuitry 210 includes a pair of cross-coupled NOR gates 220 and 222 and inverters.

In this embodiment, ramp control 153 includes a CMOS inverter 233 (having PMOS and NMOS transistors) and a transistor 235 coupled between node 175 and ground. A transistor 237 is coupled between a control electrode of transistor 235 and ground. A control electrode of transistor 237 is coupled through an inverter to node 136. A transistor 239 is coupled between the control electrode of transistor 235 and node 169. A control electrode of transistor 239 is coupled through two inverters to node 136. A transistor 241 is coupled between the control electrode of transistor 235 and node 169. A control electrode of transistor 241 is coupled through the inverter to node 136.

Transistors 235, 237, and 239 are NMOS transistors in this embodiment. Transistor 241 is a PMOS transistor. Other types of devices may be used in other embodiments.

The di/dt detect circuit 155 includes a diode-connected transistor 245 between node 169 and ground. A transistor 248 is coupled between power and node 169, and a transistor 250 is coupled between node 169 and ground. A control electrode of transistor 248 is coupled to node 253. A control electrode of transistor 250 is coupled to node 255. A transistor 257 is coupled between power and node 255. A diode-connected transistor 259 is coupled between node 255 and ground. A control electrode of transistor 257 is coupled to a node 261. A diode-connected transistor 264 is coupled between power and node 261. A diode-connected transistor 267 is coupled between node 261 and ground.

A transistor 269 is coupled between node 261 and ground. A control electrode of transistor 269 is coupled through a resistor 272 to node 175. Resistor 272 may be implemented using a resistor or other techniques for creating a resistor on an integrated circuit (e.g., using a transistor). A diode-connected transistor 275 is coupled between power an node 278. A diode-connected transistor 280 is coupled between node 278 and ground. A transistor 282 is coupled between node 278 and ground.

Transistors 248, 257, 264, and 275 are PMOS transistors. Transistors 245, 250, 259, 267, 269, 280, and 282 are NMOS transistors.

Ramp control circuit 163 includes a transistor 305 coupled between power and node 173. A transistor 308 is coupled between power and a control electrode 310 of transistor 305. A control electrode of transistor 308 is coupled through and inverter to node 136. A transistor 313 is coupled between node 167 and node 310. A control electrode of transistor 313 is coupled through two inverters to node 136. A transistor 316 is coupled between node 167 and node 310. A control electrode of transistor 316 is coupled through the inverter to node 136.

In this embodiment, transistors 305, 308, and 313 are PMOS transistors. Transistor 136 is an NMOS transistor.

The di/dt detect circuit 165 includes a CMOS inverter 318 a diode-connected transistor 319 coupled between power and node 167. A transistor 321 is coupled between power and node 167, and a transistor 323 is coupled between node 167 and ground. A control electrode of transistor 321 is coupled to a node 326. A control electrode of transistor 323 is coupled to a node 328. A diode-connected transistor 332 is coupled between power and node 326. A transistor 335 is coupled between node 326 and ground. A control electrode of transistor 335 is coupled to a node 338.

A transistor 341 is coupled between power and node 338. A control electrode of transistor 341 is coupled through a resistor 343 to a node 173. Resistor 343 may be implemented using a resistor or other techniques for creating a resistor on an integrated circuit (e.g., using a transistor). A diode-connected transistor 345 is coupled between node 338 and ground. A diode-connected transistor 347 is coupled between power and node 338. A diode-connected transistor 350 is coupled between power and a node 352.

A transistor 355 is coupled between power and node 352. A control electrode of transistor 355 is coupled to node 173. A diode connected transistor 358 is coupled between node 352 and ground.

In this embodiment, transistors, 319, 321, 332, 341, 347, 350, and 355 are PMOS transistors. Transistors 323, 335, 345, and 358 and NMOS transistors.

The ground noise reduction circuitry operates as follows. The slew rate for MOS1 is controlled by a combination of inverter 233 and transistor 235, among other devices. Initially, before a high-to-low transition, node 136 will be high, and node 175 will be low. Transistor 235 will be controlled via its control electrode, which is coupled through transistors 239 and/or 241 to di/dt detect circuit 155.

Node 175 will begin to transition from low-to-high (to cause a high-to-low transition at the output). As this occurs, the di/dt detect circuit monitors any ground noise via its connection to ground, and the ramp circuit monitors the output 136. As the noise level rises above a threshold level (which may be set by the circuitry), transistor 235 is turned on more strongly to decrease the slew rate on line 175. A reduction in slew rate on line 175 causes a corresponding reduction in slew rate at node 136. This reduces the amount of ground noise.

The power noise reduction circuitry operates similarly to the ground noise reduction circuitry. The slew rate for MOS2 is controlled by a combination of inverter 318 and transistor 305, among other devices. Initially, before a low-to-high transition, node 136 will be low, and node 173 will be high. Transistor 305 will be controlled via its control electrode, which is coupled through transistors 316 and/or 313 to di/dt detect circuit 165.

Node 173 will begin to transition from high-to-low (to cause a low-to-high transition at the output). As this occurs, the di/dt detect circuit monitors any power noise via its connection to power, and the ramp circuit monitors the output 136. As the noise level rises above a threshold level (which may be set by the circuitry), transistor 305 is turned on more strongly to decrease the slew rate on line 173. A reduction in slew rate on line 173 causes a corresponding reduction in slew rate at node 136. This reduces the amount of power noise.

This description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. An output buffer comprising:
   a pull-down driver coupled between an output node and a ground electrode;
   a ramp control circuit coupled between a logical input signal and a control electrode input to the pull-down driver, wherein the ramp control has an input coupled to the output node; and
   a ground noise detect circuit coupled to the ground electrode, and coupled to control the ramp circuit to decrease a slew rate of a low-to-high transition of a signal applied to the control electrode input to the pull-down driver in response to ground noise above a threshold value at the ground electrode, wherein the ramp control circuit comprises:
   a first inverter having an input coupled to the output node;
   a first transistor coupled between the control electrode input of the pull-down driver and the ground electrode; and a second transistor coupled between a first gate of the first transistor and an output of the ground noise detect circuit, wherein a second gate of the second transistor is coupled to an output of the first inverter.

2. The output buffer of claim 1 wherein the ground noise detect circuit is coupled to control the ramp circuit to increase the slew rate of the low-to-high transition of a signal applied to the control electrode when the ground noise is below the threshold value at the ground electrode.

3. The output buffer of claim 1 further comprising:
a pull-up driver coupled between the output node and a power potential;
a second ramp control circuit coupled between the logical input signal and a control electrode of the pull-up driver; and
a power noise detect circuit to adjust the slew rate of an output signal from the second ramp control circuit in response to noise at the power potential.

4. The output buffer of claim 1 wherein the ramp control circuit further comprises:
a third transistor, coupled between the first gate and the ground potential, having a third gate coupled to the output of the first inverter.

5. The output buffer of claim 4 wherein the ramp control circuit further comprises:
a fourth transistor, coupled between the first gate and the output of the ground noise detect circuit, having a fourth gate coupled to a second inverter, wherein the second inverter is coupled to the first inverter.

6. An output buffer comprising:
a pull-down driver having a control electrode; and
a control circuit comprising:
a first transistor having a gate coupled to the control electrode of the pull-down driver, wherein a source electrode of the first transistor is coupled to a ground potential;
a second transistor, diode-connected and coupled between the first transistor and the ground potential; and
a third transistor, diode-connected and coupled between a power potential and the first and second transistors.

7. The output buffer of claim 6 wherein the control circuit further comprises:
a fourth transistor, diode-connected and coupled between an output node of the control circuit and the ground potential; and
a fifth transistor coupled between the power potential and the output node of the control circuit, wherein a gate of the fifth transistor is coupled to the third transistor.

8. An integrated circuit comprising:
a pull-up driver coupled between a power supply and an integrated circuit output; and
a ramp circuit coupled to a control electrode of the pull-up driver, wherein the ramp circuit comprises:
a first transistor coupled between the power supply and the control electrode, having a first gate; and
a second transistor coupled between a power noise detect circuit output and the first gate and having a second gate coupled to the integrated circuit output.

9. The integrated circuit of claim 8 further comprising:
a second ramp control circuit coupled to a second control electrode of a pull-down driver, wherein the second ramp control circuit controls whether the pull-down driver is turned on or off.

10. The integrated circuit of claim 8 wherein between the second gate and the integrated circuit output are at least two inverters in series.

11. The integrated circuit of claim 8 wherein the pull-up driver is a PMOS transistor.

12. An integrated circuit comprising:
a pull-up driver coupled between a power supply and an integrated circuit output; and
a ramp circuit coupled to a control electrode of the pull-up driver, wherein the ramp circuit comprises:
a first transistor coupled between the power supply and the control electrode, having a first gate; and
a second transistor coupled to the first gate and having a second gate coupled to the integrated circuit output; and
a power noise detect circuit comprising an output coupled to the second transistor.

13. The integrated circuit of claim 12 wherein the power noise detect circuit further comprises:
a third transistor, coupled between the power supply and a first node, having a third gate coupled to the control electrode of the pull-up driver; and
a fourth transistor coupled between a first node and a ground supply, wherein a fourth gate of the fourth transistor is coupled to the ground supply.

14. The integrated circuit of claim 12 wherein the power noise detect circuit comprises an amplifier circuit responsive to voltage changes at the power supply.

15. The integrated circuit of claim 12 wherein the pull-up driver is a PMOS transistor.

16. The integrated circuit of claim 12 further comprising:
a second ramp control circuit coupled to a second control electrode of a pull-down driver, wherein the second ramp control circuit controls whether the pull-down driver is turned on or off.

17. A method of reducing noise at an output of an integrated circuit comprising:
providing an output driver coupled to a supply and the output of the integrated circuit;
providing a ramp circuit to drive a control electrode of the output driver, wherein the ramp circuit comprises:
a first transistor coupled between the control electrode and the supply; and
a second transistor coupled between a first gate of the first transistor and the supply, wherein a second gate of the second transistor receives a signal feeding back from an output of the integrated circuit;
providing a noise detection circuit to monitor noise at the supply; and
providing a signal from the noise detection circuit to increase a slew rate of a signal from the ramp circuit when the noise is below a threshold value.

18. The method of reducing noise of claim 17 wherein the supply is a ground supply for an integrated circuit.

19. The method of reducing noise of claim 17 wherein the supply is a positive power supply for the integrated circuit.

20. The method of reducing noise of claim 17 further comprising:
using the signal from the noise detection circuit, decreasing the slew rate of the ramp circuit when the noise is above the threshold value.

21. An integrated circuit comprising:
a pull-up driver coupled between a power supply and an integrated circuit output; and a ramp circuit coupled to a control electrode of the pull-up driver, wherein the ramp circuit comprises:
a first transistor coupled between the power supply and the control electrode, having a first gate; and
a second transistor coupled to the first gate and having a second gate coupled to the integrated circuit output,
wherein logical circuitry coupled to the ramp control circuit comprises a pair of cross-coupled NOR gates.

22. The integrated circuit of claim 21 wherein the pull-up driver is a PMOS transistor.

23. The integrated circuit of claim 21 further comprising:
a power noise detect circuit comprising an output coupled to the second transistor.

24. The integrated circuit of claim 23 wherein the power noise detect circuit further comprises:

a third transistor, coupled between the power supply and a first node, having a third gate coupled to the control electrode of the pull-up driver; and
a fourth transistor coupled between a first node and a ground supply, wherein a fourth gate of the fourth transistor is coupled to the ground supply.

25. The integrated circuit of claim 23 wherein the power noise detect circuit comprises an amplifier circuit responsive to voltage changes at the power supply.

26. The integrated circuit of claim 21 further comprising:
a second ramp control circuit coupled to a second control electrode of a pull-down driver, wherein the second ramp control circuit controls whether the pull-down driver is turned on or off.

* * * * *